United States Patent
Kato et al.

(10) Patent No.: US 10,304,948 B2
(45) Date of Patent: May 28, 2019

(54) SEMICONDUCTOR DEVICE

(71) Applicant: FUJI ELECTRIC CO., LTD., Kanagawa (JP)

(72) Inventors: Yoshiharu Kato, Matsumoto (JP); Hidenori Takahashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/390,682

(22) Filed: Dec. 26, 2016

(65) Prior Publication Data
US 2017/0110560 A1  Apr. 20, 2017

Related U.S. Application Data

(63) Continuation of application No. PCT/JP2016/052784, filed on Jan. 29, 2016.

(30) Foreign Application Priority Data

Jan. 29, 2015  (JP) .................... 2015-015420

(51) Int. Cl.
| | | |
|---|---|---|
| *H01L 29/739* | (2006.01) | |
| *H01L 29/40* | (2006.01) | |
| *H01L 29/10* | (2006.01) | |
| *H01L 29/06* | (2006.01) | |

(52) U.S. Cl.
CPC ...... *H01L 29/7396* (2013.01); *H01L 29/0619* (2013.01); *H01L 29/0623* (2013.01);
(Continued)

(58) Field of Classification Search
CPC . H01L 29/404; H01L 29/0623; H01L 29/407; H01L 29/402; H01L 29/0619; H01L 29/696; H01L 29/7811
See application file for complete search history.

(56) References Cited

U.S. PATENT DOCUMENTS

| | | | | |
|---|---|---|---|---|
| 2008/0169526 A1* | 7/2008 | Wakimoto | .......... | H01L 29/0619 257/490 |
| 2011/0049562 A1* | 3/2011 | Suzuki | ................ | H01L 23/4824 257/139 |

(Continued)

FOREIGN PATENT DOCUMENTS

| | | |
|---|---|---|
| JP | H11-330456 A | 11/1999 |
| JP | 2008-193043 A | 8/2008 |

(Continued)

OTHER PUBLICATIONS

Office Action issued for counterpart Japanese Application 2016-572207, issued by the Japan Patent Office dated Sep. 5, 2017.
(Continued)

*Primary Examiner* — Matthew L Reames
*Assistant Examiner* — John A Bodnar

(57) ABSTRACT

To provide a semiconductor device in which an edge termination structure can be made smaller easily. A semiconductor device is provided, the semiconductor device including an active region and an edge termination structure formed on a front surface side of a semiconductor substrate, wherein an edge termination structure has a guard ring provided surrounding an active region on a front surface side of a semiconductor substrate, a first field plate provided on a front surface side of a guard ring, an electrode unit provided on a front surface side of a first field plate, a second field plate provided between a first field plate and a electrode unit, and a conductive connecting unit which mutually electrically connects a first field plate, an electrode unit, a second field plate, and a guard ring.

14 Claims, 11 Drawing Sheets

(52) U.S. Cl.
CPC ...... *H01L 29/0696* (2013.01); *H01L 29/1095* (2013.01); *H01L 29/404* (2013.01); *H01L 29/7395* (2013.01)

(56) References Cited

U.S. PATENT DOCUMENTS

| | | | |
|---|---|---|---|
| 2011/0204469 A1* | 8/2011 | Onishi | H01L 29/0619 |
| | | | 257/490 |
| 2013/0214394 A1* | 8/2013 | Senoo | H01L 29/02 |
| | | | 257/629 |
| 2014/0374791 A1* | 12/2014 | Matsudai | H01L 29/404 |
| | | | 257/139 |
| 2015/0054118 A1* | 2/2015 | Senoo | H01L 29/404 |
| | | | 257/490 |
| 2015/0364541 A1 | 12/2015 | Senoo | |

FOREIGN PATENT DOCUMENTS

| | | | |
|---|---|---|---|
| JP | 2009-117715 A | 5/2009 | |
| JP | 2011-040773 A | 2/2011 | |
| JP | 2011171552 A | 9/2011 | |
| WO | 2014125626 A1 | 8/2014 | |

OTHER PUBLICATIONS

International Search Report for International Patent Application No. PCT/JP2016/052784, issued by the Japan Patent Office dated Apr. 26, 2016.

Office Action issued for counterpart Japanese Application 2016-572207, issued by the Japan Patent Office dated Mar. 6, 2018.

\* cited by examiner

SEMICONDUCTOR DEVICE

The contents of the following Japanese patent applications are incorporated herein by reference:
NO. 2015-015420 filed in JP on Jan. 29, 2015, and
NO. PCT/JP2016/052784 filed on Jan. 29, 2016.

BACKGROUND

1. Technical Field

The present invention relates to a semiconductor device.

2. Related Art

Conventionally, a structure in which a field plate that mitigates concentration of electric field is provided in an edge termination structure in which a semiconductor element for electric power, etc. is provided is known (for example, refer to Patent Documents 1 and 2). The field plate is, for example, formed from a metal material.

PRIOR ART DOCUMENTS

Patent Documents

Patent Document 1: Japanese Patent Application Publication No. H11-330456
Patent Document 2: Japanese Patent Application Publication No. 2008-193043

By performing etching, such as wet-etching, on a metal film, a field plate having a predetermined pattern is formed. However, a side-etching amount of a metal film is great. For this reason, if a field plate having a predetermined pattern is formed, a width of a pattern must be made additionally greater, according to an amount of side-etching. For this reason, it is difficult to make the edge termination structure smaller, preventing a semiconductor chip from becoming smaller.

SUMMARY

In an embodiment of the present invention, a semiconductor device may comprise an active region and an edge termination structure. The active region and the edge termination structure may be formed on a front surface side of a semiconductor substrate. The edge termination structure may have a guard ring, a first field plate, an electrode unit, a second field plate, and a conductive connecting unit. The guard ring may be provided surrounding the active region on the front surface side of the semiconductor substrate. The first field plate may be provided on a front surface side of the guard ring. The electrode unit may be provided on a front surface side of the first field plate. The second field plate may be provided between the first field plate and the electrode unit. The conductive connecting unit may mutually electrically connect the first field plate, the electrode unit, the second field plate, and the guard ring. A side-etching amount of the second field plate may be smaller than that of the electrode unit.

The second field plate may be formed from a semiconductor material. The electrode unit may be formed from a metal material.

In a radial direction of the guard ring, a width of the second field plate may be greater than a width of the electrode unit.

In the radial direction of the guard ring, a width of the second field plate may be greater than a width of the first field plate.

The semiconductor device may further comprise a first insulation film and a second insulation film. The first insulation film may be formed between the first field plate and the second field plate. The second insulation film may be formed between the second field plate and the electrode unit. The conductive connecting unit may have a first conductive unit and a second conductive unit. The first conductive unit may penetrate the first insulation film and the second insulation film, and connect the electrode unit and the first field plate. The second conductive unit may penetrate the second insulation film, and connect the electrode unit and the second field plate.

The first conductive unit may further penetrate a third insulation film between the guard ring and the first field plate, and further connect the electrode unit and the guard ring.

The first conductive unit and the second conductive unit may be arrayed along a circumferential direction of the guard ring, on a surface parallel to the surface of the semiconductor substrate.

The second field plate may have a first annular unit, a second annular unit, and a partial connecting unit. The first annular unit may be formed covering an end portion of the first field plate, the end portion being located inward in the radial direction of the guard ring. The second annular unit may be formed covering an end portion of the first field plate, the end portion being located outward in the radial direction of the guard ring. The second annular unit may be separated from the first annular unit. The partial connecting unit may be provided on a portion in a circumferential direction of the first annular unit and the second annular unit. The partial connecting unit may partially connect the first annular unit and the second annular unit. The second conductive unit may connect the partial connecting unit and the electrode unit.

The first conductive unit may penetrate a region that is not provided with the partial connecting unit and is between the first annular unit and the second annular unit.

The guard ring may have a plurality of straight line portions and a plurality of corner portions. The corner portions may connect respective straight line portions. The first conductive unit and the second conductive unit may be provided in the corner portions.

The semiconductor device may have the first guard ring and the second guard ring, on the front surface side of the semiconductor substrate. The first guard ring may surround the active region. The second guard ring may surround the first guard ring. The first field plate, the electrode unit, the second field plate, and the conductive connecting unit may be provided on respective guard rings. Between the first guard ring and the second guard ring, an interval of the second field plate may be narrower than an interval of the first field plate.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the scope of claim. Also, all the combinations of the features described in the embodiments are not necessarily essential to means provided by aspects of the invention.

Figure 1:
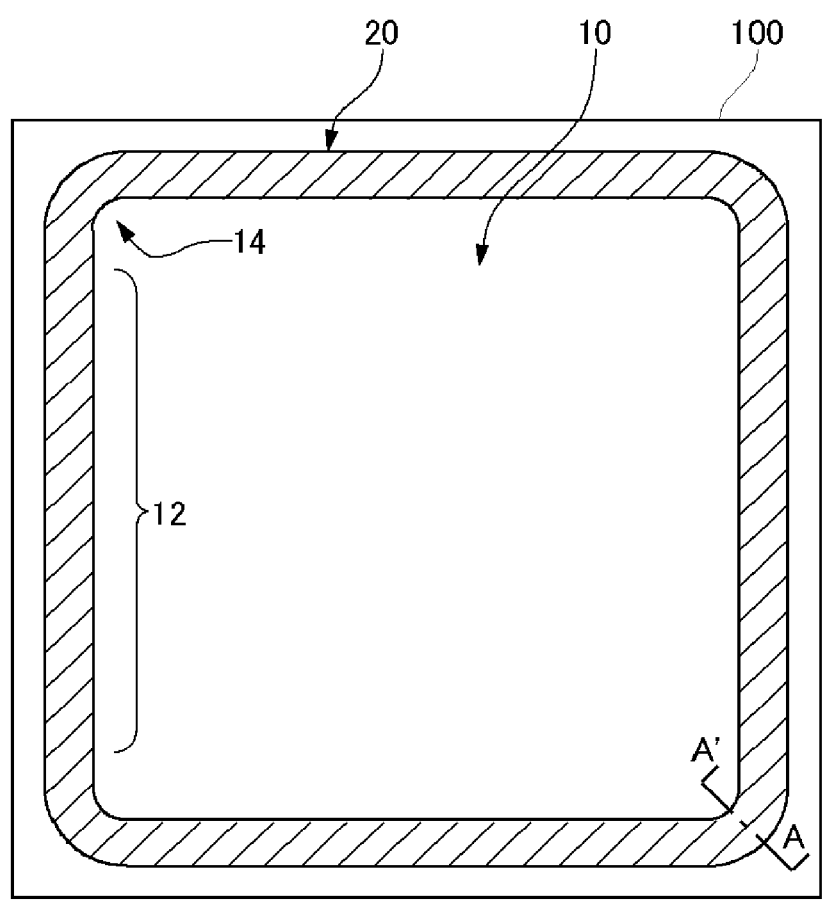
FIG. 1 shows one example of a semiconductor device 100.

FIG. 1 shows one example of the semiconductor device 100. In FIG. 1, a surface structure of the semiconductor device 100 is shown. The semiconductor device 100 comprises an active region 10 and an edge termination structure 20 formed on a front surface side of a semiconductor substrate such as a silicon substrate.

In the active region 10, a plurality of semiconductor elements are formed. The semiconductor element may be semiconductor elements having high withstand voltages such as IGBTs. For example, in the active region 10, an emitter region, a base layer, a drift layer, a collector layers, etc. which function as channels, of IGBTs are sequentially formed in a depth direction.

The edge termination structure 20 is provided on an outer side of the active region 10, on the substrate front surface of the semiconductor device 100. The edge termination structure 20 of the present example is provided surrounding the active region 10, on a substrate end portion of the semiconductor device 100. The edge termination structure 20 may be formed annularly along sides of the substrate of the semiconductor device 100. For example, the edge termination structure 20 has a plurality of straight line portions 12 and a plurality of corner portions 14. The straight line portions 12 are formed parallel to the substrate of the semiconductor device 100. The corner portions 14 are formed in the corner portions of the substrate of the semiconductor device 100, and connect the adjacent straight line portions 12. The corner portions 14 have, for example, a curved shape such as an arc.

Figure 2:
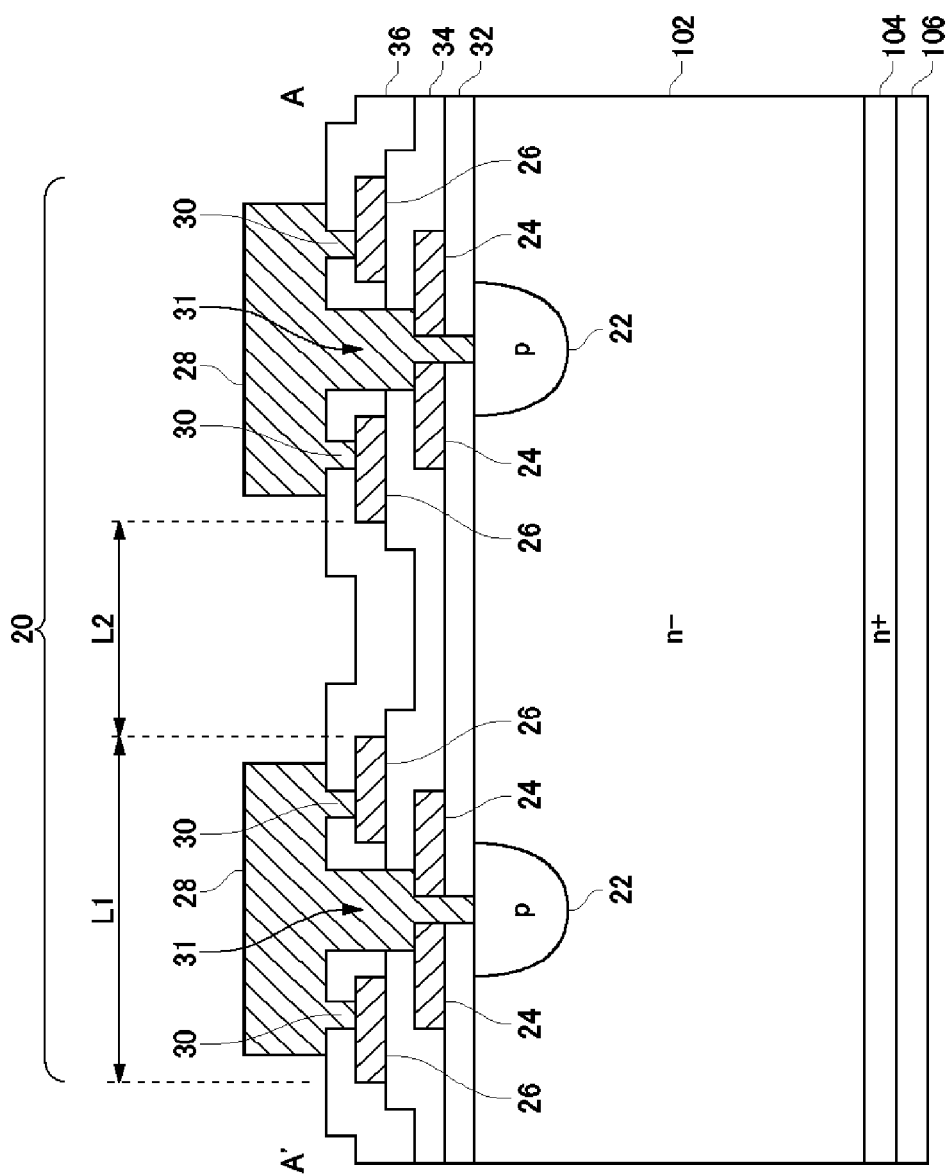
FIG. 2 shows one example of a cross-sectional structure of an edge termination structure 20 according to a first embodiment.

FIG. 2 shows one example of a cross-sectional structure of the edge termination structure 20 according to a first embodiment. In the present example, a cross-section taken along A-A' in FIG. 1 is shown. In the cross-section, the semiconductor device 100 comprises a guard ring 22, a first field plate 24, a second field plate 26, an electrode unit 28, a first conductive unit 31, a second conductive unit 30, a front surface side layer 102, a first insulation film 34, a second insulation film 36, a third insulation film 32, a rear surface side layer 104, and a rear surface side electrode 106.

The front surface side layer 102, for example, functions as a drift layer of semiconductor elements such as IGBTs. The rear surface side layer 104, for example, functions as a collector layer of semiconductor elements such as IGBTs. The rear surface side electrode 106, for example, functions as a collector electrode of semiconductor elements such as IGBTs. The front surface side layer 102, the rear surface side layer 104, and the rear surface side electrode 106 are formed extending also to the active region 10.

On a front surface side of the front surface side layer 102 in the active region 10, for example, a base layer of semiconductor elements such as IGBTs, an emitter region, etc. are properly formed. A cross-sectional structure of the semiconductor device 100 is not limited to those which have the front surface side layer 102, the rear surface side layer 104, and the rear surface side electrode 106. The semiconductor device 100 has a cross-sectional structure that varies according to a semiconductor element formed in the active region 10.

In the edge termination structure 20, one or more guard rings 22 are formed on the front surface side of the front surface side layer 102. The guard ring 22 has a conductivity type different from that of the front surface side layer 102. In the present example, the front surface side layer 102 is of n-type, and the guard ring 22 is of a p type. Thereby, a depletion layer is formed between the guard ring 22 and the front surface side layer 102, enabling a depletion layer to extend in a substrate end portion direction of the semiconductor device 100. However, a depletion layer end portion (a depletion layer end) on a side of a circumferential direction of the substrate (an extending direction of the depletion layer) separates from the substrate end portion without reaching the substrate end portion.

The guard ring 22 has an annular shape, and is provided surrounding the active region 10 shown in FIG. 1. If a plurality of guard rings 22 are provided, the respective guard rings 22 are concentrically provided. For example, among the plurality of guard rings 22, an innermost guard ring 22 is provided surrounding the active region 10, and a next guard ring 22 is provided surrounding the innermost guard ring 22. The shape of the guard ring 22 on a surface of the semiconductor device 100 may be a shape similar to that of the edge termination structure 20 shown in FIG. 1.

The third insulation film 32 is formed on a surface of the front surface side layer 102. The third insulation film 32 may be a layer obtained by oxidizing the front surface side layer 102, a layer obtained by depositing a dielectric by CVD, etc., or an insulation film formed by other methods. The third insulation film 32 is formed between and separates the front surface side layer 102 and the first field plate 24.

The first field plate 24 is provided on a front surface side of the guard ring 22. The first field plate 24 of the present example is formed in a predetermined pattern on a surface of the third insulation film 32. The first field plate 24 has, for example, an annular shape, and is formed to cover the guard ring 22. The area of the first field plate 24 on a plane parallel to the substrate front surface of the semiconductor device 100 may be greater than the area of the guard ring 22.

The first insulation film 34 is formed on a surface of the first field plate 24 and the third insulation film 32. Also, the first insulation film 34 is formed between and separates the first field plate 24 and the second field plate 26.

The second field plate 26 is provided between the first field plate 24 and the electrode unit 28. The second field plate 26 of the present example is formed in a predetermined pattern on a surface of the first insulation film 34. The second field plate 26 has, for example, an annular shape, and is formed so as to cover the first field plate 24. However, the second field plate 26 does not have to cover at least a partial region of the first field plate.

For example, as shown in FIG. 2, a width L1 of the second field plate 26 in a radial direction of the guard ring 22 is greater than a width of the first field plate 24 in the direction. Here, the radial direction of the guard ring 22 refers to, for example, like an A-A' direction shown in FIG. 1, a direction substantially perpendicular to a circumferential direction (an extending direction) of the guard ring 22. A position of a substrate-wise inner end portion of the second field plate 26 in the radial direction (an A'-side end portion in FIG. 2) may be arranged inward substrate-wise in the semiconductor device 100 from a substrate-wise inner end portion of the first field plate 24. Also, a position of a substrate-wise outer end portion of the second field plate 26 in the direction (an A-side end portion in FIG. 2) may be arranged outward substrate-wise in the semiconductor device 100 from a substrate-wise outer end portion of the first field plate 24. The area of the second field plate 26 on a plane parallel to the substrate front surface of the semiconductor device 100 may be greater than the area of the first field plate 24. Also, between two guard rings 22, an interval L2 of the second field plate 26 may be narrower than an interval of the first field plate 24.

The second insulation film 36 is formed on the surfaces of the second field plate 26 and the first insulation film 34. Also, the second insulation film 36 is formed between the second field plate 26 and the electrode unit 28, separating them.

The electrode unit 28 is provided closer to the surface than the first field plate 24 and the second field plate 26. The electrode unit 28 of the present example is formed in a predetermined pattern on a surface of the second insulation film 36. The electrode unit 28 has, for example, an annular shape, and is formed at a partial region facing the second field plate 26. The electrode unit 28 of the present example covers a center region in a radial direction of the second field plate 26, and does not cover an end portion region thereof.

As shown in FIG. 2, a width L1 of the second field plate 26 in a radial direction of the guard ring 22 is greater than a width of the electrode unit 28 in the direction. A position of a substrate-wise inner end portion of the second field plate 26 in the direction may be arranged inward substrate-wise in the semiconductor device 100 from a substrate-wise inner end portion of the electrode unit 28. Also, a position of a substrate-wise outer end portion of the second field plate 26 in the direction may be arranged outward substrate-wise in the semiconductor device 100 from a substrate-wise outer end portion of the electrode unit 28.

The area of the second field plate 26 on a plane parallel to the substrate front surface of the semiconductor device 100 may be greater than the area of the electrode unit 28. The width of the electrode unit 28 in the radial direction of the guard ring 22 may be greater or smaller than that of the first field plate 24.

The first conductive unit 31 and the second conductive unit 30 function as the conductive connecting unit which mutually electrically connects the first field plate 24, the second field plate 26, and the electrode unit 28. The first conductive unit 31 of the present example penetrates the first insulation film 34 and the second insulation film 36, and connects the electrode unit 28 and the first field plate 24. Also, the first conductive unit 31 further penetrates the first field plate 24 and the third insulation film 32, and is connected to a surface of the guard ring 22.

By a voltage applied to the electrode unit 28, spreading of a depletion layer in a joint part between the guard ring 22 and the front surface side layer 102 can be controlled. In the first insulation film 34, an opening may be formed so as to expose a portion of a surface of the first field plate 24. In the first field plate 24, an opening with a smaller diameter than the above-mentioned opening is formed. The first conductive unit 31 may be formed along the surface and the side surface of the first field plate 24.

The second conductive unit 30 penetrates the second insulation film 36, and connects the electrode unit 28 and the second field plate 26. An embodiment of the conductive connecting unit is not limited to an embodiment shown in FIG. 2. The conductive connecting unit may be in any form that allows mutually electrically connecting the guard ring 22, the first field plate 24, the second field plate 26, and the electrode unit 28. As another example, the second conductive unit 30 may connect the first field plate 24 and the second field plate 26.

A side-etching amount of the second field plate 26 is smaller than that of the electrode unit 28. Here, a side-etching amount refers to, if the layer is etched in a depth direction and a predetermined pattern is formed, an amount of etching in a direction parallel to the surface of the semiconductor substrate. For example, the second field plate 26 is formed from a semiconductor material such as conductive polysilicon in which a dopant such as phosphorus is doped, and the electrode unit 28 is formed from a metal material such as aluminum in which silicon is doped. The electrode unit 28 may be formed by the same process by which a metal electrode formed on the front surface side of the active region 10 is formed.

Also, the second field plate 26 may be thinner than the electrode unit 28. Here, a thickness of the electrode unit 28 refers to a thickness of a part being exposed on a surface of the second insulation film 36. Thereby, a side-etching amount of the second field plate 26 can be made smaller than that of the electrode unit 28. The second field plate 26 of the present example is formed from a semiconductor material, and is thinner than the electrode unit 28 of a metal material.

A width of the second field plate 26 of the present example is greater than that of the electrode unit 28. For this reason, external charges, etc. are effectively shielded by the second field plate 26, preventing unnecessary charges being charged to the third insulation film 32, etc.

Also, the second field plate 26 is formed by etching, in a predetermined pattern, a semiconductor material such as polysilicon formed on a surface of the first insulation film 34. A side-etching amount of the second field plate 26 is smaller than that of the electrode unit 28. For this reason, if the second field plate 26 having a predetermined width L1 is formed with a predetermined interval L2 in order for the second field plate 26 to function as a shield, a width of a pattern needs not be made greater taking into consideration of side-etching to be performed.

The interval of the pattern L2 is set so as to be as small as possible, for example, according to a performance of a semiconductor manufacturing device. As described above, because an effect of a side-etching amount is small for the second field plate 26, a pattern interval in order to form the second field plate 26 can be made nearly equal to the interval L2 that the second field plate 26 is to have. For this reason, the edge termination structure 20 can be made smaller, and it becomes possible to make the semiconductor device 100 smaller.

Also, by forming the second field plate 26 from a semiconductor material, etching becomes easy, enabling reduction in variations of a shape of the second field plate 26. By reducing variations of a shape of the second field plate 26 which projects outermost in an edge termination structure, and is formed on the respective guard rings 22, a width of each edge termination structure can be accurately controlled.

Figure 3:
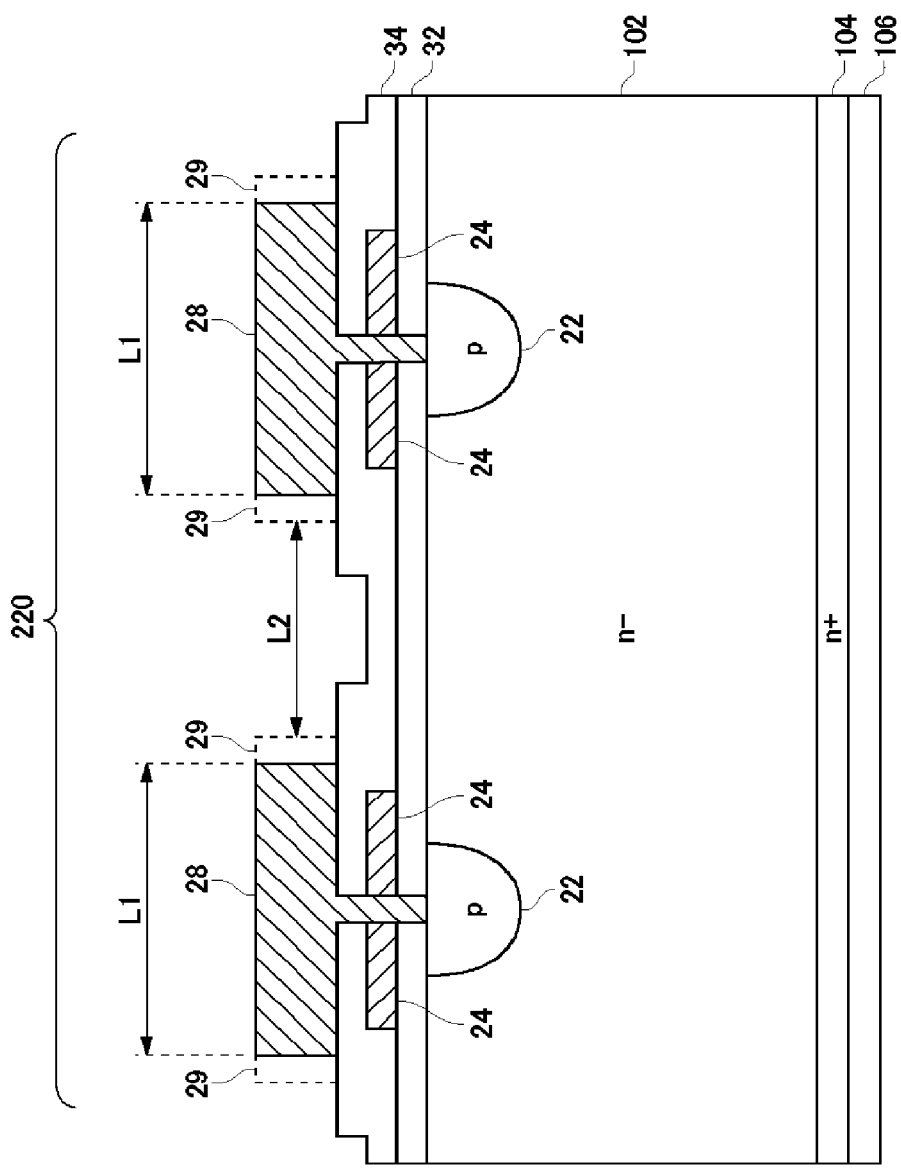
FIG. 3 shows a cross-sectional structure of an edge termination structure 220 as a comparative example.

FIG. 3 shows a cross-sectional structure of an edge termination structure 220 as a comparative example. The edge termination structure 220 does not have a second field plate 26, but an electrode unit 28 also functions as a shield. The electrode unit 28 is formed from a metal material such as aluminum.

A case in which a width of the electrode unit 28 is made to be L1 in order for the electrode unit 28 to function as a shield is considered. The electrode unit 28 is formed by etching, according to a pattern 29, a metal material formed on the entire surface of the first insulation film 34. Because a side-etching amount of the electrode unit 28 is greater than that of the second field plate 26, a width of the pattern 29 must be made greater by the above-mentioned side-etching amount. For this reason, it is difficult to make the edge termination structure 220 smaller.

Also, an interval of the pattern 29 is set to be as small as possible, for example, according to a performance of a semiconductor manufacturing device. That is, an interval of the pattern 29 is equal to the interval L2 shown in FIG. 2. As described above, because the electrode unit 28 is side-etched, an interval of the electrode unit 28 is greater than L2.

Figure 4:
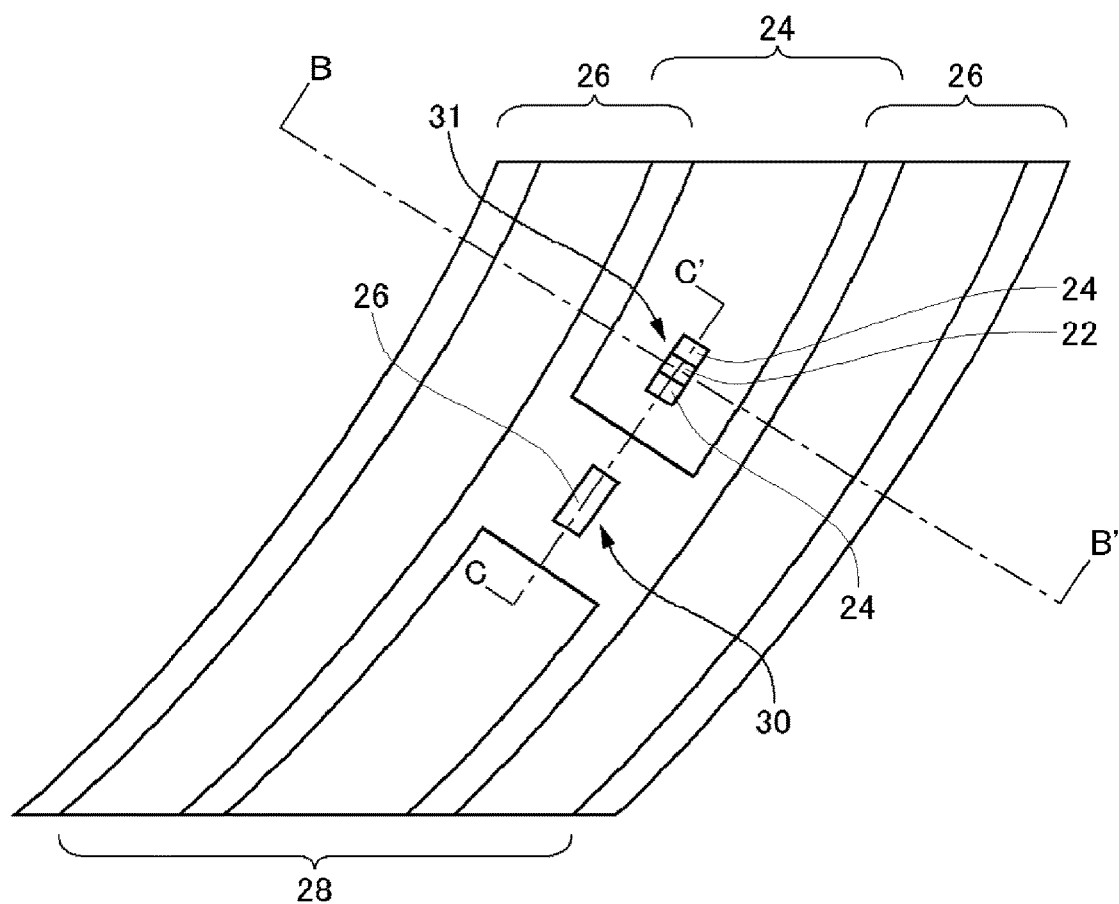
FIG. 4 shows one example of an edge termination structure 20 according to a second embodiment.

FIG. 4 shows one example of the edge termination structure 20 according to a second embodiment. In the example shown in FIG. 2, the first conductive unit 31 and the second conductive unit 30 are arrayed along a radial direction of the guard ring 22. In contrast, in the present example, the first conductive unit 31 and the second conductive unit 30 are arrayed along a circumferential direction of the guard ring 22.

In FIG. 4, an outline of the edge termination structure 20 in a corner portion 14 seen from a front surface side of the semiconductor device 100 is shown. In FIG. 4, boundaries of a laminated first field plate 24 and second field plate 26, and the electrode unit 28 are all shown by solid lines; however, actually, a portion of these boundaries are not observed from the front surface side of the semiconductor device 100.

Figure 5:
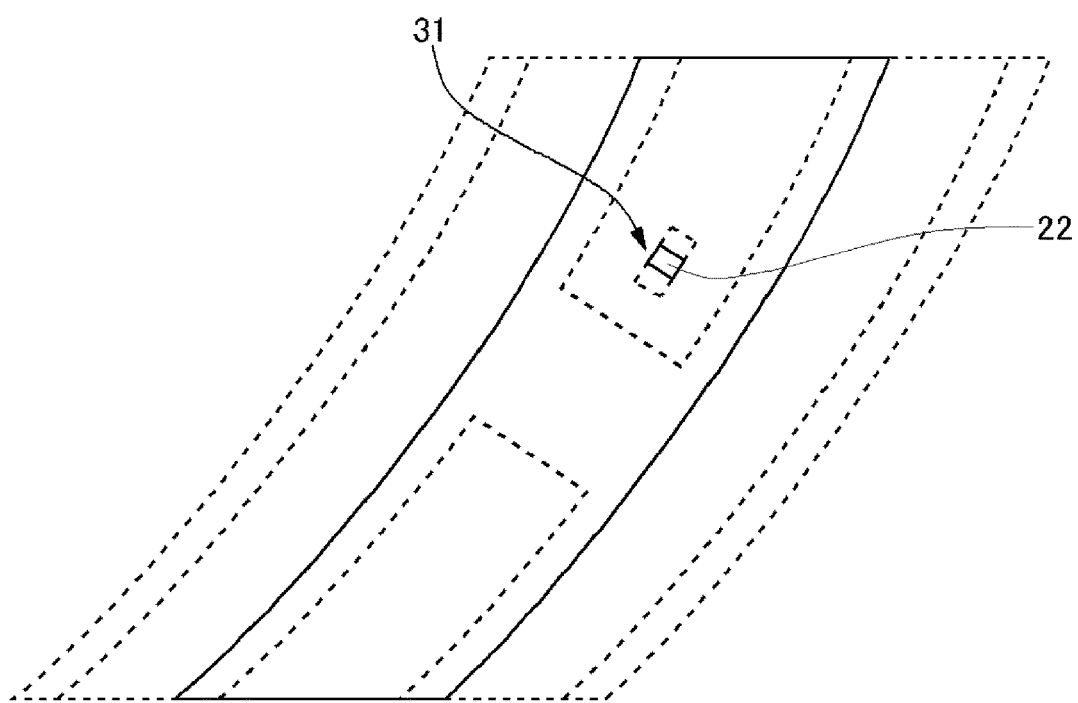
FIG. 5 shows a shape of a first field plate 24 with solid lines.
Figure 6:
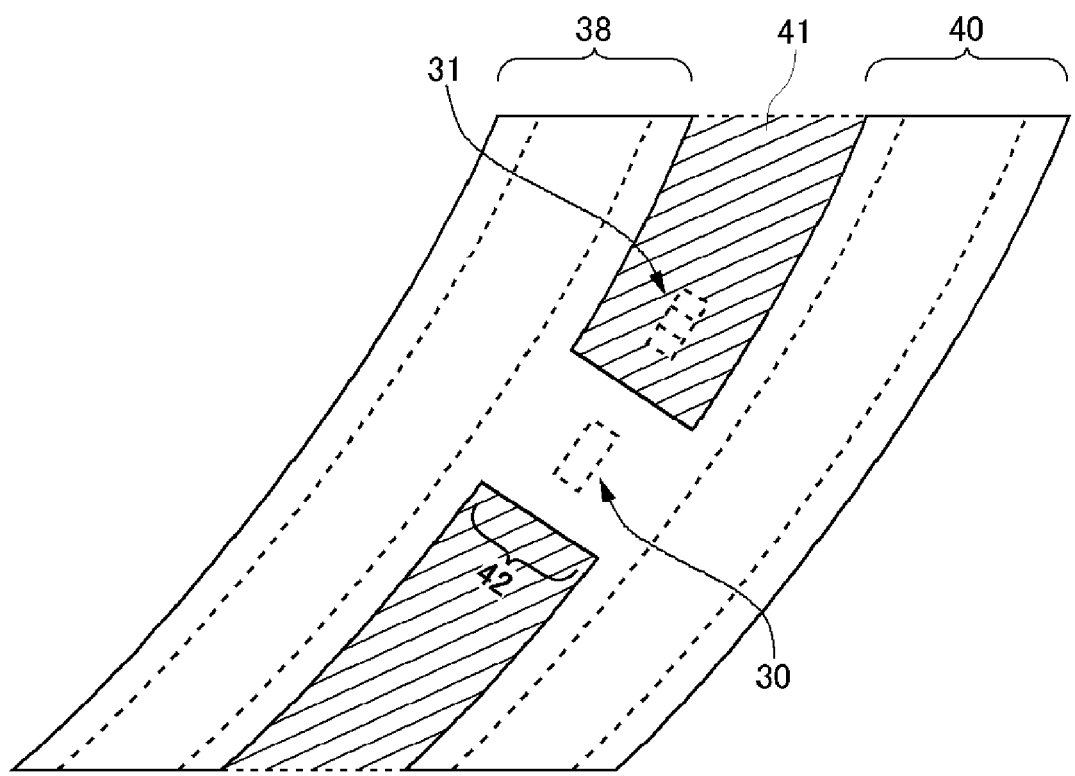
FIG. 6 shows a shape of a second field plate 26 with solid lines.
Figure 7:
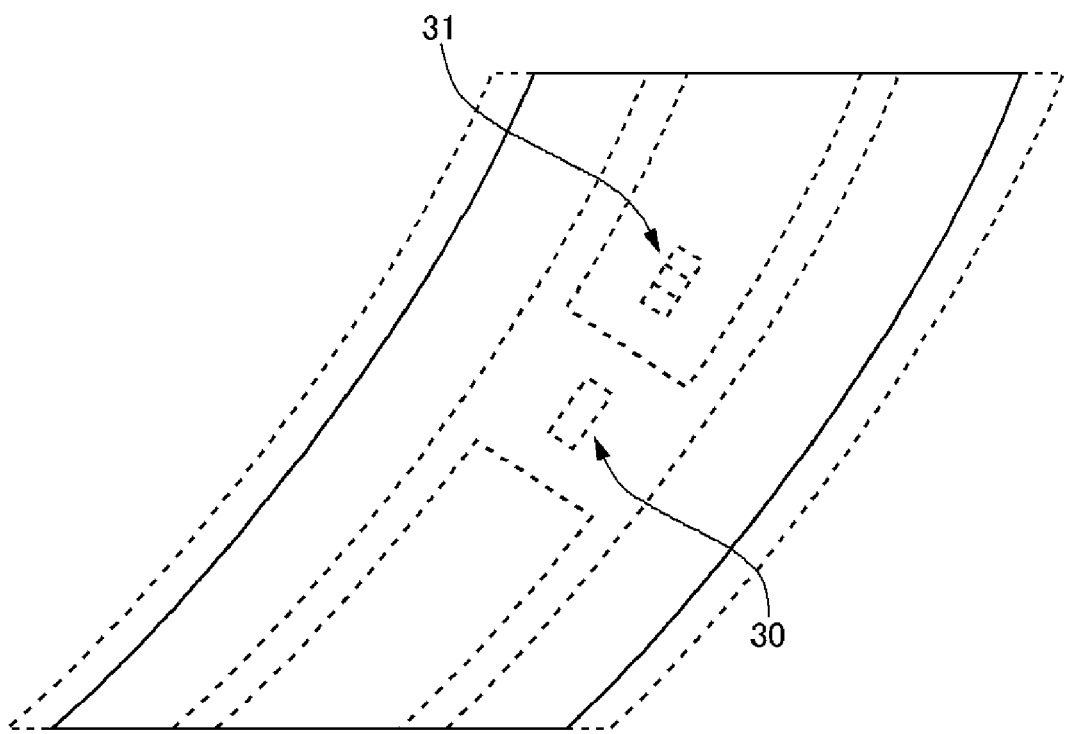
FIG. 7 shows a shape of an electrode unit 28 with solid lines.

Also, in FIGS. 5 to 7, examples of each shape of the first field plate 24, the second field plate 26, and the electrode unit 28 are shown. FIG. 5 shows a shape of a first field plate 24 with solid lines. Dotted lines in FIG. 5 show another layer of the edge termination structure 20 shown in FIG. 4. FIG. 6 shows a shape of a second field plate 26 with solid lines. FIG. 7 shows a shape of an electrode unit 28 with solid lines.

As shown in FIG. 5, the first field plate 24 has an opening in a corner portion 14. By the above-mentioned opening, a surface of the guard ring 22 is exposed. Through the above-mentioned opening, the first conductive unit 31 penetrates the first field plate 24. In a radial direction of the guard ring 22, a width of the first field plate 24 is smaller than a width of the second field plate 26.

As shown in FIG. 6, the second field plate 26 has a first annular unit 38, a second annular unit 40, and a partial connecting unit 42. The first annular unit 38 is formed covering an end portion of the first field plate 24, the end portion being located inward in the radial direction of the guard ring 22. Also, the second annular unit 40 is formed covering an end portion of the first field plate 24, the end portion being located outward in the radial direction of the guard ring 22. The first annular unit 38 and the second annular unit 40 are formed mutually separated. The first annular unit 38 and the second annular unit 40 may be concentrically formed.

The partial connecting unit 42 is provided on a portion in a circumferential direction of the first annular unit 38 and the second annular unit 40, and partially connects the first annular unit 38 and the second annular unit 40. In FIG. 6, among regions sandwiched between the first annular unit 38 and the second annular unit 40, a region 41 in which the partial connecting unit 42 is not formed is hatched. Because the second field plate 26 is not formed in a region 41, in the region 41, the second field plate 26 does not overlap with the first field plate 24. In the present example, the first conductive unit 31 is provided in the region 41.

The second conductive unit 30 connects the partial connecting unit 42 and the electrode unit 28. That is, a rear surface side edge portion of the second conductive unit 30 is connected to the partial connecting unit 42, as shown in FIG. 6. Also, the first conductive unit 31 penetrates each layer in a region in which the partial connecting unit 42 is not formed among regions sandwiched between the first annular unit 38 and the second annular unit 40, and the first conductive unit 31 connects the electrode unit 28 and the guard ring 22.

A width of the second field plate 26 may be greater than those of both the electrode unit 28 and the first field plate 24. A width of the second field plate 26 refers to a width from an end portion in a substrate inside of the first annular unit 38 to an end portion in a substrate outside of the second annular unit 40. A width of the first annular unit 38 and a width of the second annular unit 40 may be the same, or may be different.

As shown in FIG. 7, to a rear surface side of the electrode unit 28, the first conductive unit 31 and the second conductive unit 30 are connected. The first conductive unit 31, the second conductive unit 30, and the electrode unit 28 may be integrally formed from the same material.

As described above, because the partial connecting unit 42 that connects the first annular unit 38 and the second annular unit 40 is partially formed on the second field plate 26 of the present example, the first conductive unit 31 and the second conductive unit 30 can be arrayed along a circumferential direction of the guard ring 22. For this reason, compared to the case in which the first conductive unit 31 and the second conductive unit 30 are arrayed along a radial direction of the guard ring 22, a width of the edge termination structure 20 can be made smaller, and making the semiconductor device 100 smaller becomes easy.

The width of the electrode unit 28 is preferably a width which is reduced by a side-etching amount of the electrode unit 28 from the width of the second field plate 26 or smaller. Thereby, an interval of a pattern when etching the electrode unit 28 can be L2 or smaller. Also, because the second field plate 26 mainly functions as a shield, a width of the electrode unit 28 may be still smaller.

As one example, a width of the electrode unit 28 in the radial direction of the guard ring 22 may be smaller than or equal to a half of that of the second field plate 26. Also, a width of the first field plate 24 in the radial direction of the guard ring 22 may be the same as, smaller than or equal to a half of, or smaller than or equal to one third of that of the second field plate 26.

The first field plate 24 and the second field plate 26 may have approximately the same thickness. Also, as the second field plate 26 mainly functions as a shield, a thickness of the second field plate 26 may be greater than that of the first field plate 24.

In FIGS. 4 to 7, positions of the first conductive unit 31 and the second conductive unit 30 in the radial direction of the guard ring 22 are the same; however, positions of the first conductive unit 31 and the second conductive unit 30 in the radial direction may be displaced from each other. That is, a straight line that links the first conductive unit 31 and the second conductive unit 30 may be parallel to a circumferential direction of the guard ring 22, or may be slightly displaced from the parallel.

Also, the first conductive unit 31 and the second conductive unit 30 may be formed in respective corner portions 14 of the edge termination structure 20. Also, in any of corner portions 14, none of the first conductive unit 31 and the second conductive unit 30 may be formed. In two diagonally-placed corner portions 14 among four corner portions 14, for example, the first conductive unit 31 and the second conductive unit 30 are formed, while in other two corner portions 14, no conductive unit is formed.

Also, in respective corner portions 14, only either of the first conductive unit 31 and the second conductive unit 30 may be formed. In two diagonally-placed corner portions 14 among four corner portions 14, for example, the first conductive unit 31 is formed, while in two other diagonally-placed corner portions 14, the second conductive unit 30 is formed. Also, the first conductive unit 31 may be formed in any of corner portions 14, while the second conductive unit 30 may be formed in the diagonally-placed corner portion 14. In the remaining two corner portions 14, any of conductive units may not be formed.

Figure 8:
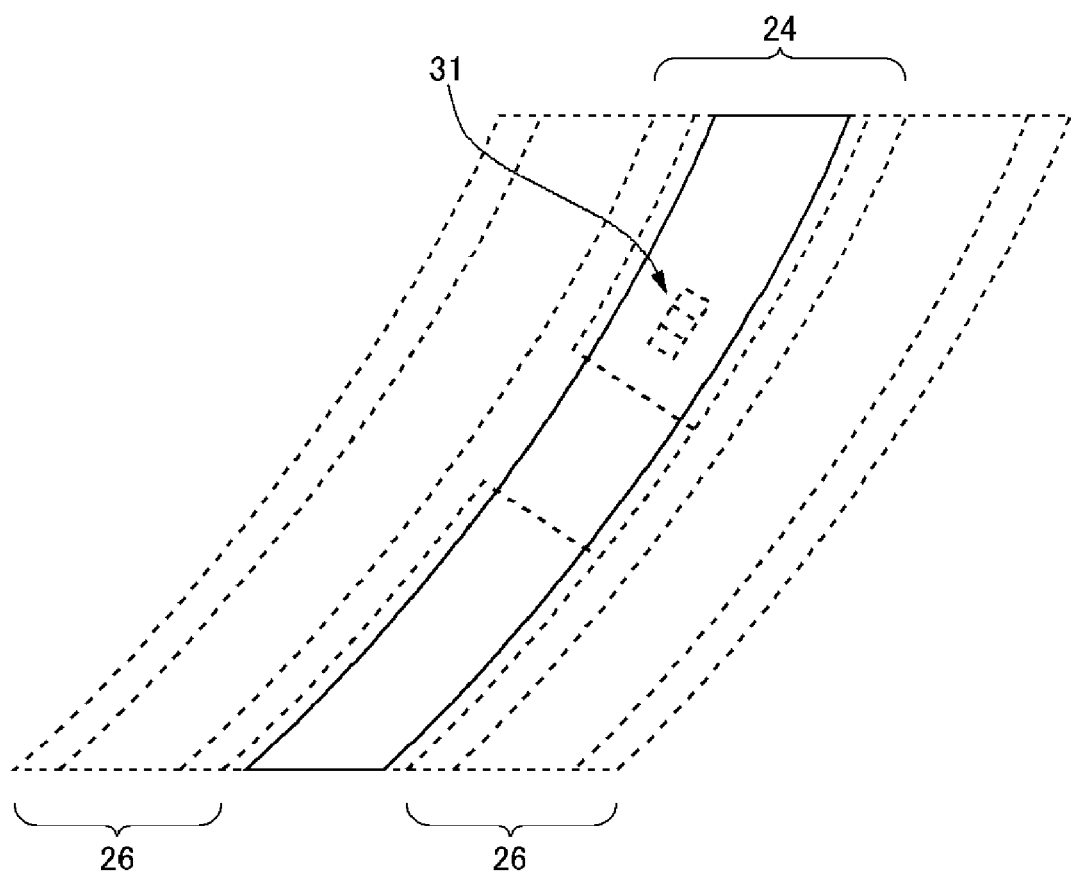
FIG. 8 shows one example of a positional relationship between each element shown in FIGS. 4 to 7 and a guard ring 22.

FIG. 8 shows one example of a positional relationship between each element shown in FIGS. 4 to 7 and the guard ring 22. In FIG. 8, a shape of the guard ring 22 is shown with solid lines. As described above, the guard ring 22 has the annular shape, and is provided on a rear surface side of the first field plate 24. The guard ring 22 of the present example is entirely covered by the first field plate 24. Also, the guard ring 22 is electrically connected to the electrode unit 28 by the first conductive unit 31. In FIG. 8, a position of an end portion of the guard ring 22 and a position of an end portion of the second field plate 26 are separated; however, an end portion of the guard ring 22 may overlap with an end portion of the second field plate 26.

Figure 9:
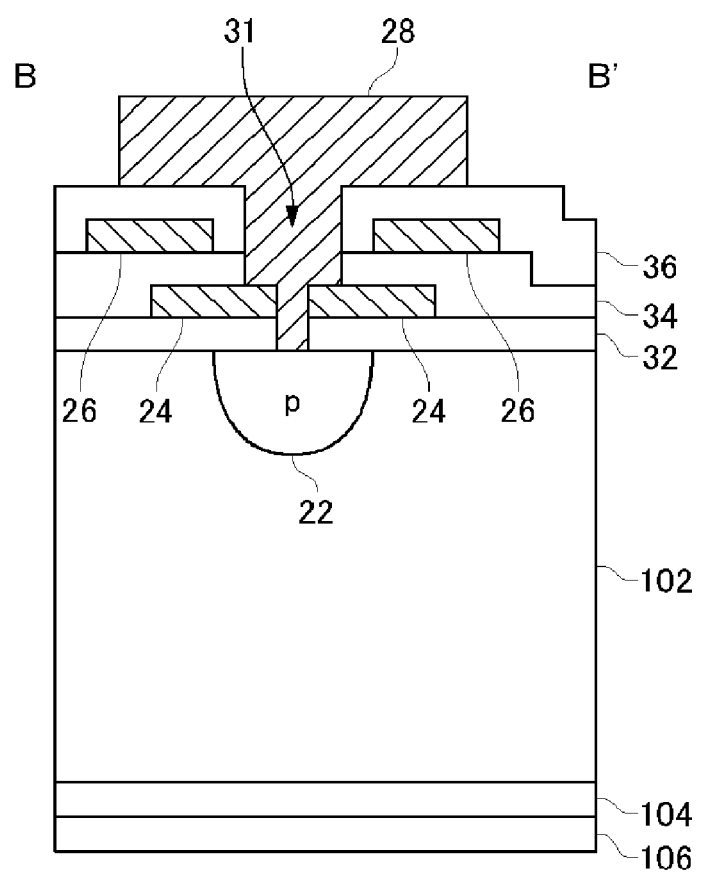
FIG. 9 shows a cross-section taken along B-B' in FIG. 4.

FIG. 9 shows a cross-section taken along B-B' in FIG. 4. In FIG. 9, one guard ring 22 is shown; however, as in the previous example shown in FIG. 2, the edge termination structure 20 has a plurality of guard rings 22. In the present example, because the first conductive unit 31 and the second conductive unit 30 are arrayed along a circumferential direction of the guard ring 22, in a cross-section taken along B-B' in a radial direction of the guard ring 22 passing the first conductive unit 31, the second conductive unit 30 does not exist. In other respects, the structure may be the same as the example shown in FIG. 2.

Figure 10:
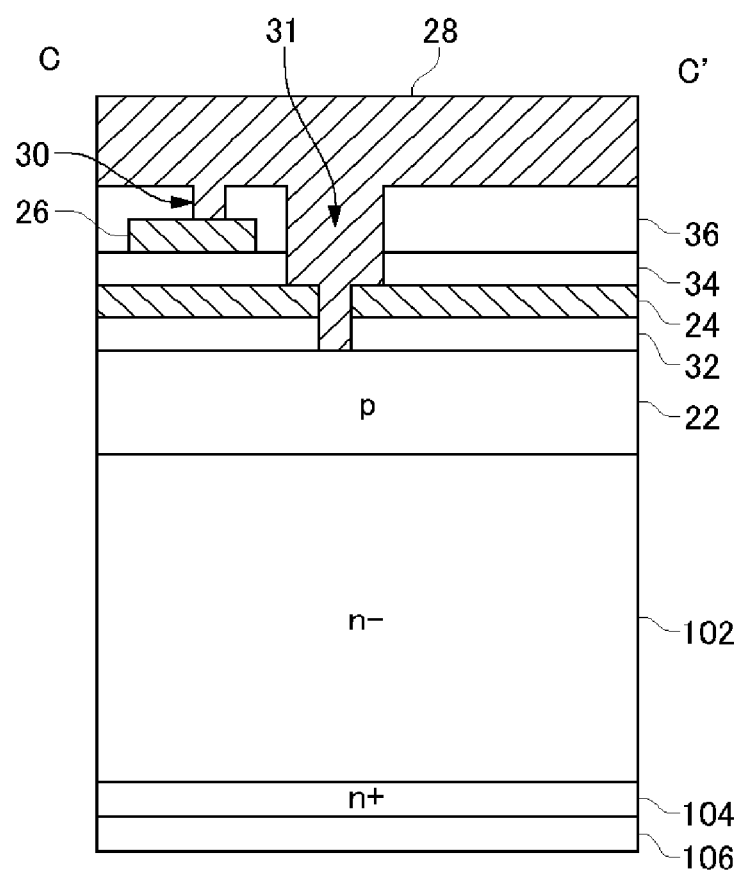
FIG. 10 shows a cross-section taken along C-C' in FIG. 4.

FIG. 10 shows a cross-section taken along C-C' in FIG. 4. Because a cross-section taken along C-C' is a cross-section along a circumferential direction of the guard ring 22, both the first conductive unit 31 and second conductive unit 30 exist in the cross-section. The second field plate 26 exists only on the C-side to the first conductive unit 31, and does not exist on the C'-side. This is because the partial connecting unit 42 shown in FIG. 6 exists on the C-side to the first conductive unit 31, while the partial connecting unit 42 does not exist on the C'-side.

Figure 11:
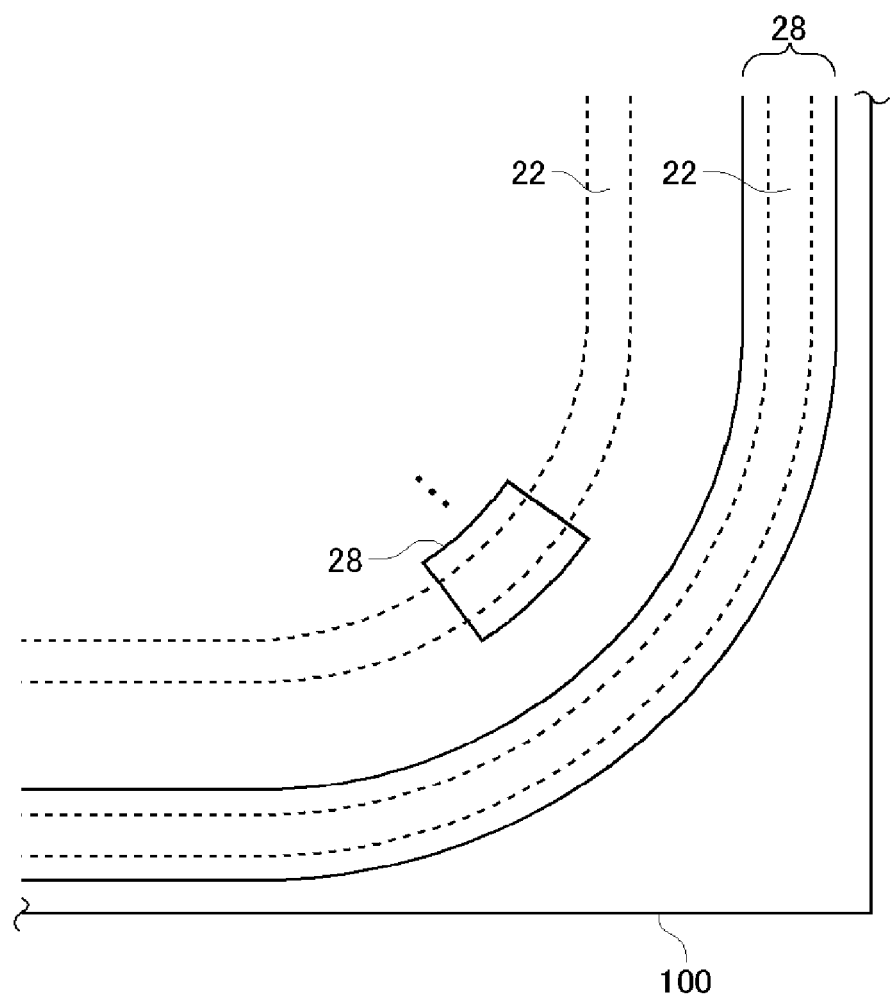
FIG. 11 shows an exemplary structure of the electrode unit 28.

FIG. 11 shows an exemplary structure of the electrode unit 28. In FIG. 11, only the electrode unit 28 and the guard ring 22 in the edge termination structure 20 are shown, and the first field plate 24, etc. are omitted. In respective guard rings 22, the electrode unit 28 may be annularly formed so as to surround the active region 10, or may be formed only in the corner portions 14 but not in the straight line portions 12. In any of the structures, the first conductive unit 31 is preferably provided in the corner portions 14. If the electrode unit 28 is provided only in corner portions 14, the electrode unit 28 may be provided in all of the corner portions 14, and the electrode unit 28 may be selectively provided in some of the corner portions 14. For example, the electrode unit 28 may be provided in the diagonally-placed corner portions 14, and the electrode unit 28 may not be provided in the other corner portions 14.

Also, as shown in FIG. 11, in two or more guard rings 22, the guard ring 22 having the electrode unit 28 annularly formed, and the guard ring 22 having the electrode unit 28 formed only in the corner portions 14 may be alternately arranged. Also, in two or more guard rings 22 in which the electrode unit 28 is provided only in the corner portions 14, the corner portions 14 in which the electrode unit 28 is provided may be made different. For example, while in one guard ring 22, the electrode unit 28 may be provided in the two diagonally-placed corner portions 14, in the other adjacent guard rings 22, the electrode unit 28 may be provided in the diagonally-placed corner portions 14 which are orthogonal to the above-mentioned diagonal.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS

100: semiconductor device; 10: active region; 12: straight line portion; 14: corner portion; 20: edge termination structure; 22: guard ring; 24: first field plate; 26: second field plate; 28: electrode unit; 29: pattern; 30: second conductive unit; 31: first conductive unit; 32: third insulation film; 34: first insulation film; 36: second insulation film; 38: first annular unit; 40: second annular unit; 42: partial connecting unit; 102: front surface side layer; 104: rear surface side layer; 106: rear surface side electrode; 220: edge termination structure

What is claimed is:

1. A semiconductor device comprising an active region and an edge termination structure that are formed on a front surface side of a semiconductor substrate, wherein
the edge termination structure has:
a guard ring provided surrounding the active region on the front surface side of the semiconductor substrate;
a first field plate provided on a front surface side of the guard ring;
an electrode unit provided on a front surface side of the first field plate;
a second field plate provided between the first field plate and the electrode unit; and a conductive connecting unit which mutually electrically connects the first field plate, the electrode unit, the second field plate, and the guard ring, wherein a width of the second field plate in a radial direction of the guard ring is greater than a width of the electrode unit; and in a radial direction of the guard ring, an inner end portion of the second field plate is arranged inward than an inner end portion of the first field plate that is electrically connected to the second field plate at the conductive connecting unit, and an outer end portion of the second field plate is arranged outward than an outer end portion of the first field plate that is electrically connected to the second field plate at the conductive connecting unit.

2. The semiconductor device according to claim 1, wherein the second field plate is formed from a semiconductor material, and the electrode unit is formed from a metal material.

3. The semiconductor device according to claim 2, wherein in a radial direction of the guard ring, a width of the second field plate is greater than a width of the first field plate.

4. The semiconductor device according to claim 1, further comprising:

a first insulation film formed between the first field plate and the second field plate; and a second insulation film formed between the second field plate and the electrode unit, wherein the conductive connecting unit has:

a first conductive unit which penetrates the first insulation film and the second insulation film, and connects the electrode unit and the first field plate, and a second conductive unit which penetrates the second insulation film, and connects the electrode unit and the second field plate.

5. The semiconductor device according to claim 4, wherein the first conductive unit further penetrates a third insulation film between the guard ring and the first field plate, and further connects the electrode unit and the guard ring.

6. The semiconductor device according to claim 5, wherein the first conductive unit and the second conductive unit are arrayed along a circumferential direction of the guard ring, on a surface parallel to a surface of the semiconductor substrate.

7. The semiconductor device according to claim 6, wherein the second field plate has:

a first annular unit formed covering an end portion of the first field plate, the end portion being located inward in the radial direction of the guard ring, a second annular unit which is formed covering an end portion of the first field plate, the end portion being located outward in the radial direction of the guard ring, and is separated from the first annular unit, and a circumferential connecting unit which is provided on a portion in a circumferential direction of the first annular unit and the second annular unit, and connects the portion of the first annular unit and the second annular unit, wherein the second conductive unit connects the circumferential connecting unit and the electrode unit.

8. The semiconductor device according to claim 7, wherein the first conductive unit penetrates a region that is not provided with the circumferential connecting unit and is between the first annular unit and the second annular unit.

9. The semiconductor device according to claim 6, wherein the guard ring has a plurality of straight line portions and a plurality of corner portions which connect respective straight line portions, and the first conductive unit and the second conductive unit are provided in the corner portions.

10. The semiconductor device according to claim 1, wherein the guard ring comprises: a first guard ring which surrounds the active region on a front surface side of the semiconductor substrate; and a second guard ring which surrounds the first guard ring on a front surface side of the semiconductor substrate, the first field plate, the electrode unit, the second field plate, and the conductive connecting unit are provided in respective guard rings, and between the first guard ring and the second guard ring, an interval of the second field plate is narrower than an interval of the first field plate.

11. The semiconductor device according to claim 4, wherein the first conductive unit and the second conductive unit are arrayed along a circumferential direction of the guard ring, on a surface parallel to a surface of the semiconductor substrate.

12. The semiconductor device according to claim 1, wherein in a radial direction of the guard ring, an inner end portion of the second field plate is arranged inward than an inner end portion of the electrode unit that is connected to the second field plate at the conductive connecting unit, and an outer end portion of the second field plate is arranged outward than an outer end portion of the electrode unit that is connected to the second field plate at the conductive connecting unit.

13. The semiconductor device according to claim 1, wherein an area of the first field plate on a plane parallel to the front surface side of the semiconductor substrate is greater than an area of the guard ring on a plane parallel to the front surface side of the semiconductor substrate.

14. The semiconductor device according to claim 1, wherein the conductive connecting unit penetrates through the first field plate to electrically connect the guard ring to the electrode unit.

* * * * *